US010554226B2

(12) United States Patent
Boutillon et al.

(10) Patent No.: US 10,554,226 B2
(45) Date of Patent: Feb. 4, 2020

(54) METHOD FOR CONTROLLING A CHECK NODE OF A NB-LDPC DECODER AND CORRESPONDING CHECK NODE

(71) Applicants: UNIVERSITÉ DE BRETAGNE SUD, Lorient (FR); TECHNISCHE UNIVERSITÄT KAISERSLAUTERN, Kaiserslautern (DE); CREONIC GMBH, Kaiserslautern (DE)

(72) Inventors: Emmanuel Boutillon, Lorient (FR); Philipp Schläfer, Neubiberg (DE); Timo Lehnigk-Emden, Kaiserslautern (DE)

(73) Assignees: UNIVERSITÉ DE BRETAGNE SUD, Lorient (FR); TECHNISCHE UNIVERSITÄT KAISERSLAUTERN, Kaiserslautern (DE); CREONIC GMBH, Kaiserslautern (DE)

(*) Notice: Subject to any disclaimer, the term of this patent is extended or adjusted under 35 U.S.C. 154(b) by 38 days.

(21) Appl. No.: 15/569,028

(22) PCT Filed: Apr. 22, 2016

(86) PCT No.: PCT/EP2016/059055
§ 371 (c)(1),
(2) Date: Oct. 24, 2017

(87) PCT Pub. No.: WO2016/170140
PCT Pub. Date: Oct. 27, 2016

(65) Prior Publication Data
US 2018/0131395 A1 May 10, 2018

(30) Foreign Application Priority Data

Apr. 24, 2015 (EP) .................................... 15290110

(51) Int. Cl.
G11C 29/00 (2006.01)
H03M 13/31 (2006.01)
(Continued)

(52) U.S. Cl.
CPC ......... $H03M\ 13/31$ (2013.01); $H03M\ 13/114$ (2013.01); $H03M\ 13/1122$ (2013.01);
(Continued)

(58) Field of Classification Search
CPC ............. H03M 13/31; H03M 13/1114; H03M 13/1171; H03M 13/1122; H03M 13/114; H03M 13/1128; H03M 13/458
See application file for complete search history.

(56) References Cited

U.S. PATENT DOCUMENTS

| 2013/0212451 A1 | 8/2013 | Nemati Anaraki et al. |
| 2015/0326249 A1* | 11/2015 | Zhang ................ G06F 11/1012 714/763 |
| 2016/0336967 A1* | 11/2016 | Boutillon ........... H03M 13/1117 |

OTHER PUBLICATIONS

Garcia-Herrero, F., et al., "A Symbol Flipping Decoder for NB-LDPC relying on Multiple Votes," 8th International Symposium on Turbo Codes and Iterative Information Processing (ISTC), IEEE, Aug. 18, 2014, pp. 203-207, XP032682400.
(Continued)

Primary Examiner — Samir W Rizk
(74) Attorney, Agent, or Firm — Kenealy Vaidya LLP

(57) ABSTRACT

Some embodiments are directed to a method for controlling a check node of a NB-LDPC decoder. The check node receives $d_c$ input lists $U_i$ and delivers and delivers $d_c$ output lists $V_i$, with $i \in [1 \ldots d_c]$. Each input list and output list includes $n_m$ elements and each element of the input or output lists includes a reliability value associated to a symbol of a
(Continued)

Galois Field GF(q) with $q > n_m$. The input elements and output elements are sorted according to the reliability values in the lists. The method is a syndrome-based method. The syndromes are sums of $d_c$ elements of input lists $U_i$. The method includes a step of syndrome calculation, a step of decorrelation and a step for generating the output list.

16 Claims, 8 Drawing Sheets

(51) Int. Cl.
*H03M 13/11* (2006.01)
*H03M 13/45* (2006.01)
(52) U.S. Cl.
CPC .... *H03M 13/1171* (2013.01); *H03M 13/1128* (2013.01); *H03M 13/458* (2013.01)

(56) References Cited

OTHER PUBLICATIONS

Garcia-Herrero, F., et al., "Multiple-Vote Symbol-Flipping Decoder for Nonbinary LDPC Codes," IEEE Transactions on Very Large Scale Integration (VLSI) Systems, Nov. 2014, pp. 1-11, XP055113701.
Zhao, S., et al., "Joint detection/decoding algorithms for non-binary low-density parity-check codes over inter-symbol interference channels," IET Commun. 2013;7(14):1522-1531, XP006045109.
Voicila, A., et al., "Low-Complexity, Low-Memory EMS Algorithm for Non-Binary LDPC Codes," Proceedings of the 2007 IEEE International Conference on Communications (ICC 2007), Jun. 24-28, 2007, Glasgow, UK, IEEE, Piscataway, NJ, USA, pp. 671-676, CP031125748.
International Search Report and Written Opinion for PCT Patent App. No. PCT/EP2016/059055 (dated May 20, 2016).
European Search Report for European Patent App. No. 15290110.4 (dated Oct. 28, 2015).

* cited by examiner

Sorted syndroms of $D_1$ and $D_2$

METHOD FOR CONTROLLING A CHECK NODE OF A NB-LDPC DECODER AND CORRESPONDING CHECK NODE

CROSS REFERENCE TO RELATED APPLICATIONS(S)

This application is a national phase filing under 35 C.F.R. § 371 of and claims priority to PCT Patent Application No. PCT/EP2016/059055, filed on Apr. 22, 2016, which claims the priority benefit under 35 U.S.C. § 119 of European Patent Application No. 15290110.4, filed on Apr. 24, 2015, the contents of each of which are hereby incorporated in their entireties by reference.

BACKGROUND

The presently disclosed subject matter relates to a method for controlling a check node of a decoder for decoding non-binary LDPC codes and to the corresponding check node.

LDPC (Low Density Parity Check) codes are known error-correcting codes for approaching Shannon's theoretical limit of transmission. Because of their performance in terms of noise immunity, LDPC codes, and in particular non-binary LDPC codes, find use in the field of transmitting and storing digital data.

Non-binary LDPC codes are constructed in a non-binary Galois field of order q, conventionally written as GF(q). An LDPC code in GF(q) is defined by a sparse parity matrix H of dimensions M×N, the elements of which belong to GF(q), N being the number of GF(q) elements in the code word and M being the number of parity constraints. For a Galois field GF(4) consisting of 4 elements $\{0, \alpha^0, \alpha^1, \alpha^2\}$, the parity matrix for N=6 and M=3, for example, is as follows:

$$H = \begin{pmatrix} 0 & \alpha^0 & \alpha^0 & 0 & \alpha^2 & 0 \\ \alpha^1 & 0 & 0 & \alpha^0 & 0 & \alpha^2 \\ \alpha^0 & 0 & \alpha^2 & 0 & 0 & \alpha^1 \end{pmatrix}$$

This matrix can likewise be shown by a bipartite graph (Tanner graph) having N variable nodes receiving the symbols of the code word and M check nodes. Each column of the parity matrix is associated with a variable node and each line of the matrix is associated with a check node. In the case of a regular LDPC code, each check node is connected, by means of $d_c$ branches, to a single number $d_c$ of variable nodes. Similarly, each variable node is connected, by means of $d_v$ branches, to a single number $d_v$ of check nodes. In the case of a regular LDPC code, the number $d_c$ or $d_v$ of branches varies according to the variable node or check node.

The decoding of these LDPC codes is iterative and can include or can consist of exchanging messages via these branches, each variable or check node processing the messages received and, after processing, delivering other messages, as the case may be, to check nodes or variable nodes to which they are connected via branches. The exchanged messages represent probability density functions of the code symbols and are therefore in the form of vectors of size q. Such decoding is described in the document entitled "Decoding Algorithms for Non binary LDPC Codes Over GF(q)" by D. Declercq and M. Fossorier, Communications IEEE Transactions in Volume 55, Issue 4, April 2007, pages 633-643.

Some embodiments specifically relate to the method for controlling check nodes of the decoder. With reference to FIG. 1, each check node CN receives a plurality of incoming messages $U_i$ and delivers outgoing messages $V_j$, with $i,j \in [1 \ldots d_c]$, such that $$V_j = \sum_{j \neq i} U_i$$

In the example of FIG. 1, the check node receives $d_c=4$ incoming messages $U_1, U_2, U_3, U_4$ and delivers 4 outgoing messages $V_1, V_2, V_3, V_4$ such as:

$$\begin{cases} V_1 = U_2 + U_3 + U_4 \\ V_2 = U_1 + U_3 + U_4 \\ V_3 = U_1 + U_2 + U_4 \\ V_4 = U_1 + U_2 + U_3 \end{cases}$$

wherein "+" is the addition operator in the Galois field GF(q).

Each incoming and outgoing message is a vector of size q, associating a probability density with each element of the Galois field. Each check node makes calculations on the incoming messages and delivers outgoing messages to the variable nodes.

Density probability functions are thus exchanged between the check nodes and the variable nodes, and conversely, until the code word has been completely decoded or a predefined number of iterations has been performed. Reference is then made to a "belief propagation" algorithm or BP algorithm.

Implementing such an algorithm is relatively complex and may require a high number of computations in the check node. With such algorithm, the complexity increases with the size of the GF(q). A straightforward implementation of the BP algorithm has a complexity of $O(q^2)$.

In order to reduce this complexity, it is known to work in the logarithmic field in order to convert the multiplications into additions. The data exchanged between nodes are log likelihood ratios (LLR).

To calculate the probability density functions of the outgoing message, another known solution for reducing the complexity can include or can consist of taking account solely of the $n_m$ greatest probability density functions in the incoming messages, $n_m < q$. This algorithm, referred to as EMS (Extended Min-Sum), is described in detail in the document entitled "Algorithmes simplifiés pour le décodage de codes LDPC non binaires" de A. Voicila, D. Declercq, M. Fossorier et F. Verdier, GRETSI, Louvain-la-Neuve, Belgium, September 2005. This solution can be combined with the preceding solution such that the data exchanged are log likelihood ratios.

According to this algorithm, the incoming messages $U_i$ are filtered and sorted prior to being processed by the check node. The messages supplied to the check node are then lists including only $n_m$ probability density function values or LLR sorted in descending order, each probability density function or LLR value being associated with an element of the Galois field GF(q). The number of probability function or LLR values taken into account by the check node being reduced ($n_m<q$), the complexity of this algorithm is reduced but remains high nonetheless.

Currently, the EMS algorithm gives the best or better compromise between hardware complexity and communications performance.

But to achieve the required throughput of today's applications, executing the algorithms in software is not sufficient. Dedicated hardware architectures become mandatory. The largest complexity in the EMS algorithm is the computation of the Check Node (CN). State-of-the-art architectures apply a so called Forward-Backward (FWBW) scheme to process the check node. This architecture is disclosed in "Log-domain decoding of LDPC codes over GF(q)", H. Wymeersch, H. Steendam, and M. Moeneclaey, Proc. IEEE International Conference on Communications, vol. 2, June 2004, pp. 772-776.

A serial calculation is carried out to reduce the hardware cost and to allow for reuse of intermediate results during the computation. However this scheme introduces high latency and degrades the throughput. This effect increases significantly when the size of the GF(q) grows.

SUMMARY

A purpose of some embodiments is to provide a scheme allowing for reduction of these drawbacks.

According to some embodiments, a new method for controlling a check node within a NB-LDPC (Non-Binary Low-Density Parity-Check) decoder allowing increased parallelism of the check node computation is proposed. The processing applied by the check node is called Syndrome-Based (SYN) Check Node (CN) processing. While achieving slightly better communications performance than state-of-the-art hardware aware decoding algorithms, the SYN CN processing has a lower complexity and the increased parallelism of the check node computation enables low latency and high throughput decoder architectures.

Some embodiments concern a method for controlling a check node of a decoder for decoding non-binary LDPC codes, the check node receiving $d_c$ input lists $U_i$ of $n_m$ elements and delivering $d_c$ output lists $V_i$ of $n'_m$ elements, with $i \in [1 \ldots d_c]$, with $d_c > 2$, each element of the input or output lists, called respectively input element and output, including a reliability value associated to a symbol of a Galois Field GF(q) with $q > n_m$ and $q > n'_m$, the input elements and output elements being substantially sorted according to the reliability values respectively in the input list and output list, the method being characterized in that it includes the following steps:

adding $d_c$ input elements of input lists $U_i$ in order to generate a plurality of sums called syndromes, each of the input elements belonging to a distinctive input list among the $d_c$ input lists $U_i$ and each syndrome including a reliability value which is the sum of the reliability values of the input elements and a symbol of the Galois field which is the sum of the symbols of the input elements in the Galois field, for each output list $V_i$, applying a decorrelation to the syndromes by subtracting the input element of the input list $U_i$ from the syndromes in order to generate decorrelated syndromes, and for each output list $V_i$, selecting, as output elements of the output list $V_i$, the $n'_m$ decorrelated syndromes having the highest reliability values and generated for the output list $V_i$.

This method allows for a massive parallel implementation, notably for the decorrelation operations, resulting in a high throughput and low latency processing.

The reliability value is preferably derived from a LLR (Log likelihood ratio) value. The highest reliability value is given by the lowest LLR value and conversely the lowest reliability value is given by the highest LLR value.

In one particular embodiment, n the adding step, each syndrome is generated based on at most k input elements different from the input elements having the highest reliability value (LLR=0), with $k<d_c$.

In this embodiment, only the syndromes with the highest reliability values are used for generating the output lists $V_i$, which makes the computation of all or most other syndromes superfluous. Only the syndromes with few deviations (with few input elements not having the highest reliability value (LLR=0)) are generated. It results that the number of syndromes to be generated is significantly reduced.

In one particular embodiment, in the adding step, each syndrome is generated based on input elements whose distance, called reliability distance, from the input elements having the highest reliability values is lower than a maximum reliability distance. The input elements with the lowest reliability values are not used for the generation of the syndromes. It also contributes to reduce the number of syndromes to be generated.

In one particular embodiment, the maximum reliability distance is depending on k. The maximum reliability distance is linked to the number of deviations for a syndrome. Advantageously, the higher the number of deviations for a syndrome, the lower the maximum reliability distance.

In one particular embodiment, the output elements of the output list $V_i$ are selected by sorting the decorrelated syndromes generated for the output list $V_i$ according to the reliability values and by selecting the $n'_m$ decorrelated syndromes having the highest reliability values (lowest LLR values). In this embodiment, sorting operations are made on the decorrelated syndromes in order to generate the output lists $V_i$.

In another particular embodiment, for an output list $V_i$ to be generated, the decorrelation is applied to syndromes generated from the input element of the input list $U_i$ having the highest reliability value (LLR=0). In this embodiment, only the syndromes using the most reliable element (LLR=0) of the input list $U_i$ are considered for generating the output list $V_i$. All or most of the other syndromes are not used. With this embodiment, no LLR subtraction operation may be required.

In a particular embodiment linked to the preceding embodiment, before the decorrelation step, the syndromes are sorted according to the reliability values of the syndromes such that, after the decorrelation step, the decorrelated syndromes generated for the output list $V_i$ are sorted according to the reliability values, and the elements of the output list $V_i$ are the $n'_m$ decorrelated syndromes having the highest reliability values. In this embodiment, the sorting operation can be done before the decorrelation step. It allows reducing significantly the number of sorters from $d_c$ to 1.

In another particular embodiment, before or after or in parallel with the syndrome generation, the method further includes the steps of:

preselecting input elements, called probes, in the input lists $U_i$, each probe having a reliability value representative for a group of p neighboring input elements including the probe, evaluating the preselected probes in order to select and sort a predetermined number of the preselected probes, the probes, called final probes, being sorted according to the reliability values; and selecting generated syndromes based on the final probes, the syndromes being sorted in the order of the final probes.

With this embodiment, the output elements of the output lists $V_i$ are not exactly sorted according to the reliability values but it is not mandatory for the variable node receiving these output lists. In this embodiment, only a reduced amount of the input elements, called probes, are used to select the syndromes to be decorrelated.

In a variant, before the syndrome generation, the method further includes the steps of:
preselecting input elements, called probes, in the input lists $U_i$, each probe having a reliability value representative for a group of p neighboring input elements including the probe, and
evaluating the preselected probes in order to select and sort a predetermined number of the preselected probes, the probes, called final probes, being sorted according to the reliability values;
and wherein, in the syndrome generation step, the syndromes are generated based on the final probes, the syndromes being sorted in the order of the final probes.

In this variant, only the syndromes based on the final probes are generated. Thus a more reduced amount of syndromes is calculated.

In a particular embodiment, in each input list $U_i$, the probes are equally distributed.

For GF(q) with high values of q (greater than 64), unequal distribution is possible.

In a particular embodiment, the probe is the input element having the highest reliability value in the group of p neighboring input elements including the probe and the reliability value of the probe is the highest reliability value.

In another embodiment, the reliability value of the probe is a combination of the reliability values of the p neighboring input elements. The reliability value of the probe is for example the average value of the reliability values of the p neighboring input elements.

Some embodiments also concern a check node of a decoder for decoding non-binary LDPC codes including:
$d_c$ inputs for receiving $d_c$ input lists $U_i$ of $n_m$ elements, called input elements, with $i \in [1 \ldots d_c]$, $n_m > 1$ and $d_c > 2$, each input element including a reliability value associated to a symbol of a Galois Field GF(q) with $q > n_m$, the input elements being substantially sorted according to the reliability values in the input list,
$d_c$ outputs for delivering $d_c$ output lists $V_i$ of $n'_m$ elements called output elements, with $q > n'_m$, each output element including a reliability value associated to a symbol of a Galois Field GF(q), the output elements being substantially sorted according to the reliability values in the output list,
a syndrome calculator for adding $d_c$ input elements of input lists $U_i$ in order to generate a plurality of sums called syndromes, each of the input element belonging to a distinctive input list among the $d_c$ input lists $U_i$ and each syndrome including a reliability value which is the sum of the reliability values of the input elements and a symbol of the Galois field which is the sum of the symbols of the input elements in the Galois field,
$d_c$ decorrelators for applying, for each output list $V_i$, a decorrelation to the syndromes by subtracting the input element of the input list $U_i$ from the syndromes in order to generate decorrelated syndromes, and
a selector that selects, for each output list $V_i$, as output elements for the output list $V_i$, $n'_m$ decorrelated syndromes having the highest reliability values and generated for the output list $V_i$.

In a particular embodiment, the check node includes $d_c$ sorters for sorting the decorrelated syndromes according to the reliability values, each one of the sorters being dedicated for sorting the decorrelated syndromes generated for a dedicated output list $V_i$.

In a particular embodiment, the check node includes one sorter for sorting the syndromes generated by the syndrome calculator according to the reliability values, the decorrelation being applied, for an output list $V_i$ to be generated, to syndromes generated from the input element of the input list $U_i$ having the highest reliability values.

In a particular embodiment, the check node further includes:
a probe selector for selecting input elements, called probes, in the input lists $U_i$, each probe having a reliability value representative for a group of p neighboring input elements including the probe,
a probe sorter for sorting the probes according to the reliability values, and
a syndrome selector selecting generated syndromes based on the sorted probes, the syndromes being sorted in the order of the sorted probes.

In a particular embodiment, the check node further includes:
a probe selector for selecting input elements, called probes, in the input lists $U_i$, each probe having a reliability value representative for a group of p neighboring input elements including the probe,
a probe sorter for sorting the probes according to the reliability values,
and wherein the syndrome calculator is driven to generate syndromes based on the sorted probes, the syndromes being sorted in the order of the sorted probes.

BRIEF DESCRIPTION OF THE FIGURES

Some embodiments can be better understood with reference to the following description and drawings, given by way of example and not limiting the scope of protection, and in which.

DETAILED DESCRIPTION OF THE EMBODIMENTS

In the description which follows, a check node is considered, receiving as input lists of $n_m$ elements sorted in descending or ascending order and delivering as outputs lists of $n'_m = n_m$ elements likewise sorted in descending or ascending order. It is likewise considered that this check node works in the logarithmic field, the data exchanged between nodes then being LLR values. Of course, $n'_m$ can be different from $n_m$.

More specifically, some embodiments will be described hereinbelow with reference to a check node receiving, as incoming messages, $d_c$ inputs $U_i$ and delivering, as outgoing messages, $d_c$ outputs $V_i$, with $i \in [1 \ldots d_c]$. Each input $U_i$ and output $V_i$ is a tuple (ordered list) of $n_m$ LLR values each associated to a symbol of GF(q), with $n_m < q$, the tuple elements being ordered according an ascending or descending order of their LLR values. The $n_m$ symbols of the tuple are the $n_m$ most reliable symbols (symbols having the lowest LLR values) as defined in the state-of-the-art EMS algorithm. The symbols (or Galois field elements) with the highest reliability value have a LLR=0.

In the following, $U_i[j]$ designates the $j^{th}$ element of the input list $U_i$ and $V_i[j]$ designates the $j^{th}$ element of the output list $V_i$, with $j \in [0 \ldots n_m-1]$.

Figure 1:
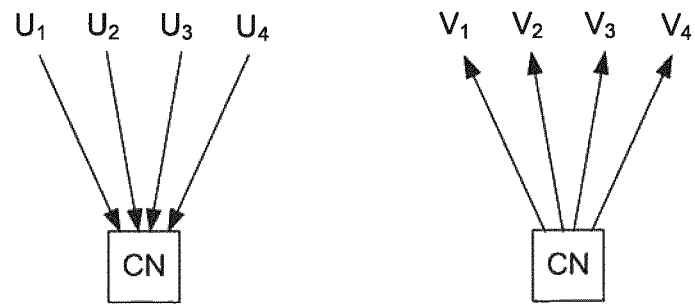
FIG. 1 is a schematic representation of a check node.

Before describing in detail the method of some embodiments for a check node with $d_c$ inputs and $d_c$ outputs, the principle of the inventive method is briefly described with a check node as illustrated by FIG. 1, with four inputs $U_1$, $U_2$, $U_3$, $U_4$ and four outputs $V_1$, $V_2$, $V_3$, $V_4$.

As mentioned before, the four outputs are as follows:

$$\begin{cases} V_1 = U_2 + U_3 + U_4 \\ V_2 = U_1 + U_3 + U_4 \\ V_3 = U_1 + U_2 + U_4 \\ V_4 = U_1 + U_2 + U_3 \end{cases}$$

It can be rewritten as follows:

$$\begin{cases} V_1 = U_1 + U_2 + U_3 + U_4 - U_1 \\ V_2 = U_1 + U_2 + U_3 + U_4 - U_2 \\ V_3 = U_1 + U_2 + U_3 + U_4 - U_3 \\ V_4 = U_1 + U_2 + U_3 + U_4 - U_4 \end{cases}$$

wherein − is the subtraction operator in Galois Field GF(q) and for LLR values.

The basic principle of some embodiments is to first calculate the sum $U_1+U_2+U_3+U_4$, called syndrome, common to all or most outputs $V_1, V_2, V_3, V_4$ before carrying out the appropriate subtraction (decorellation) in order to obtain the 4 outputs $V_1, V_2, V_3, V_4$. It allows making lots of operations in parallel.

Figure 2:
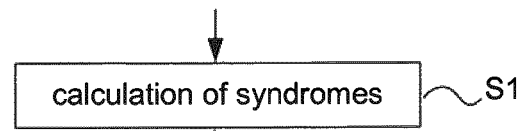
FIG. 2 is a flow chart illustrating the syndrome-based method according to some embodiments.
Figure 2:
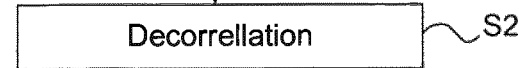
Figure 2:
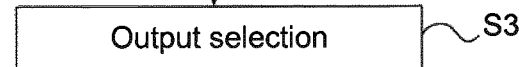
Figure 3:
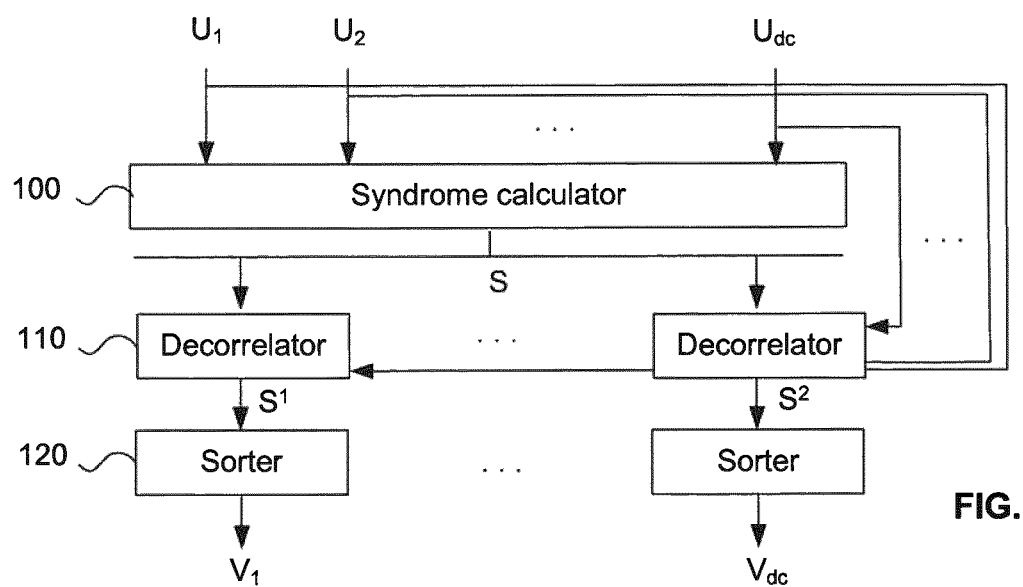
FIG. 3 is a schematic representation of a check node implementing the syndrome-based method of FIG. 2.

FIG. 2 represents a basic flow chart of the method of some embodiments and FIG. 3 represents a basic architecture for implementing the method.

According to FIG. 2, the method includes the following steps:

Step S1: adding $d_c$ input elements of input lists $U_i$ in order to generate a plurality of sums called syndromes; each of the added input elements belongs to a distinctive input list $U_i$ among the $d_c$ input lists; each syndrome includes a reliability value which is the sum of the reliability values of the input elements and a symbol of the Galois field which is also the sum of the symbols of the input elements in the Galois field; the reliability values are LLR values.

Step S2: for each output list $V_i$, a decorrelation is applied to the syndromes by subtracting the input element of the input list $U_i$ from the syndromes in order to generate decorrelated syndromes, and Step S3: for each output list $V_i$, selecting, as output elements of the output list $V_i$, the $n_m$ decorrelated syndromes having the highest reliability values and generated for the output list $V_i$.

In the step S1, a plurality of syndromes is calculated.

The set of syndromes is called S. Individual syndromes are distinguished by the elements which are chosen for the sum. This step is implemented by the syndrome calculator 10 depicted in FIG. 3.

If $x_t$ designates one element $U_i[j]$ of the input list $U_i$, with $j \in [0 \ldots n_m]$ and $i \in [1 \ldots d_c]$, the syndrome generated from the input elements $(x_1 \ldots x_{dc})$, called $SYN(x_1 \ldots x_{dc})$, is as follows:

$$SYN(x_1 \ldots x_{d_c}) = \{LLR(x_1 \ldots x_{d_c}), GF(x_1 \ldots x_{d_c})\}$$

with $$\begin{cases} LLR(x_1 \ldots x_{d_c}) = \sum_{t=1}^{d_c} LLR[x_t], \\ GF(x_1 \ldots x_{d_c}) = \sum_{t=1}^{d_c} GF[x_t], \end{cases}$$

The syndrome set S including all or most the possible syndromes includes $n_m^{d_c}$ syndromes and is defined as follows:

$$S = \{SYN(x_1 \ldots x_{d_c}) : \forall x_i \in U_i \text{ and } \forall i \in [1 \ldots d_c]\}$$

In the step S2, a decorrelation is applied to the syndromes by subtracting, for each output list $V_i$ to be generated, the input element of the input list $U_i$ from the syndromes in order to generate decorrelated syndromes. This step is implemented by the decorrelators 11 depicted in FIG. 3. The technical effect of this step is the decorrelation of the outputs of the check node from the inputs of the check node.

This step can include or can consist of generating a dedicated syndrome set $S^i$ for every output $V_i$, which has no correlation with input $U_i$:

$$S^i = \{SYN^i(x_1 \ldots x_{d_c}) : \forall\, x_i \in U_i \text{ and } \forall\, i \in [1 \ldots d_c]\}$$

with $$SYN^i(x_1 \ldots x_{d_c}) = \{R^i(x_1 \ldots x_{d_c}),\, G^i(x_1 \ldots x_{d_c})\}$$

and $$\begin{cases} LLR^i(x_1 \ldots x_{d_c}) = LLR(x_1 \ldots x_{d_c}) - LLR[x_i], \\ GF^i(x_1 \ldots x_{d_c}) = GF(x_1 \ldots x_{d_c}) - GF[x_i] \end{cases}$$

Each set Si includes $n_m^{d_c-1}$ syndromes.

Once the sets $S^i$ are computed, the decorrelated syndromes within the sets $S^i$ are sorted in the step S3 according to their syndrome reliability represented by the LLR values. The sorting step is carried by the sorters 12 depicted in FIG. 3. Each output list Vi is then constituted by the $n_m$ most reliable decorrelated syndromes of the set $S^i$.

This processing method is an alternative to state-of-the-art check node processings. It is the first approach for high-order Galois field decoding, allowing for massive parallel implementations and thus high throughput and low latency. Once the syndrome set S is calculated, the decorrelation steps and the sorting steps for every output $V_i$ can be executed in parallel. The syndrome calculation can also be done in parallel. It allows having low latency processing.

However, without special treatment, the calculation of the syndrome set S and the sorting of $S^i$ introduce a high complexity. It has to be reduced to make the algorithm attractive for hardware implementations. For that purpose, different improvements are proposed hereinafter. More specifically, different approaches for simplifications of the syndrome set generation and the sorting while maintaining the communications performance are proposed.

According to a first advantageous embodiment, the number of syndromes of the set S is reduced. For the output computation only the most reliable values of S are used which makes the computation of all or most other syndromes superfluous. Thus a smart reduction of the cardinality of S, noted |S|, can significantly reduce the overall complexity of the algorithm without sacrificing the communications performance.

The first step for a reduction of |S| is the separation of syndromes with high reliability from ones with low reliability. The syndrome set S can be defined as the union of $d_c+1$ subsets $D_k$ (also called deviation sets), with $k \in [0 \ldots d_c]$, such that:

$$S = \bigcup_{k=0}^{d_c} D_k$$

Figure 4:
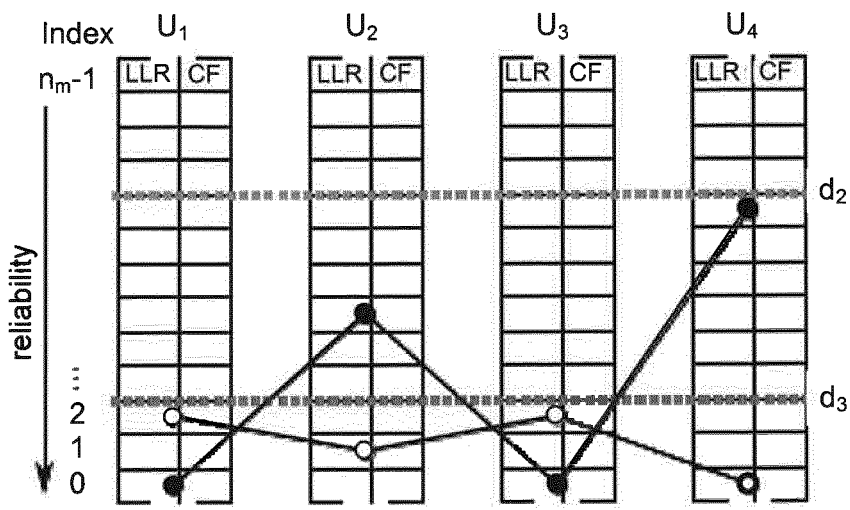
FIG. 4 is a schematic representation of syndromes.

Each subset $D_k$ contains only syndromes deviating in exactly k elements from the most reliable element. FIG. 4 represents graphically two exemplary syndromes, one with two deviations (filled circles) and one with three deviations (open circles). The deviations designate the input elements used for generating the syndrome and not having a LLR value equal to zero (highest reliability value). The subset $D_0$ contains only one syndrome, which is the sum of the most reliable elements from all or most inputs. The subset $D_1$ contains $d_c \cdot n_m$ syndromes. More generally, the subset $D_k$ contains $$\binom{d_c}{k} \cdot (n_m)^k$$

syndromes.

Figure 5:
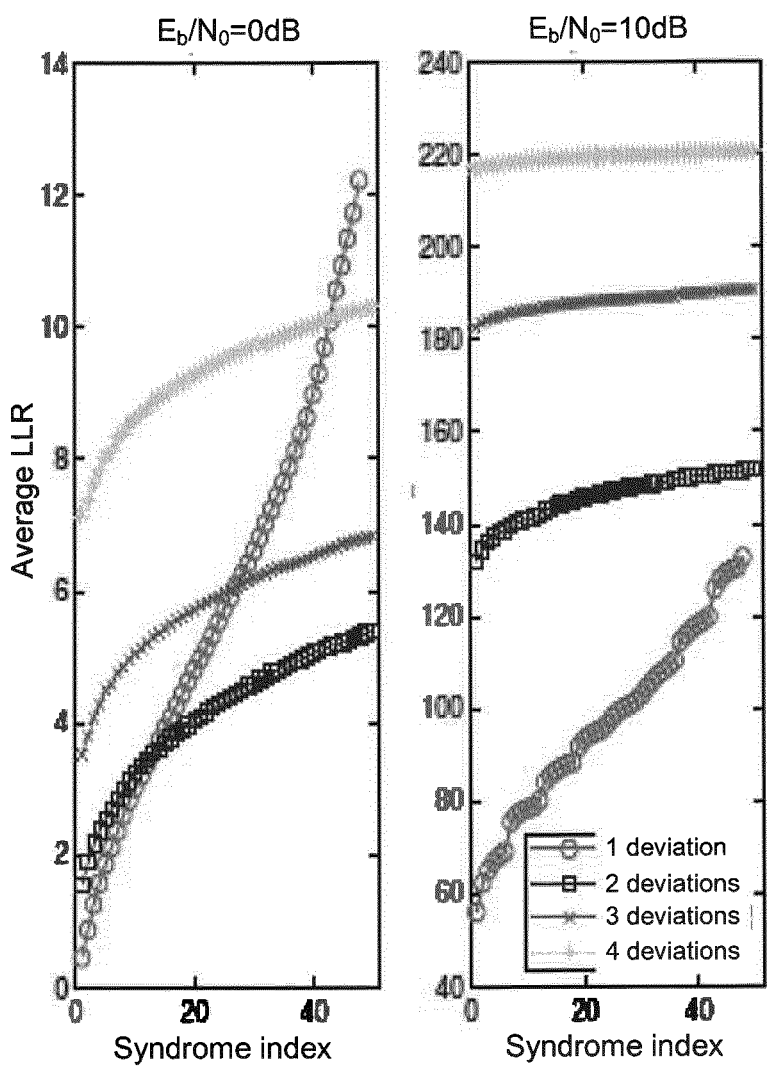
FIG. 5 are graphs showing the average LLR values of syndromes of different deviation sets.

FIG. 5 shows the average LLR values of the syndromes in the sorted deviation sets $D_k$. One can observe, that the distribution of reliable LLRs depends on the Signal-to-Noise Ratio (SNR) expressed by $E_b/N_o$. However, syndromes with more than two deviations e.g. $D_k$ for k>2 have such a low reliability (high LLR value) that they rarely contribute to the generation of the outputs $V_i$. Thus, advantageously, we can limit the calculation of subsets $D_k$ to the ones with a low amount of deviations. FIG. 5 shows that considering syndromes with one and two deviations works very well for GF(64).

Therefore, according to an advantageous embodiment, the set S is limited to the union of $D_0$, $D_1$ and $D_2$:

$$S = \bigcup_{k=0}^{2} D_k$$

Another parameter for reduction of |S| is the maximum allowed reliability distance $d_k$ of elements contributing to the deviation set $D_k$. The reliability distance describes the position of the element in the input list relative to the most reliable element (LLR=0). In FIG. 4, the most reliable element has the index zero. Less reliable elements have higher indices which describe their rank in the sorted list of LLRs.

For the calculation of $D_k$ only elements with indices less or equal to $d_k$ are considered. The maximum allowed reliability distance for a certain deviation can be set dynamically based on the LLR value of the elements or it is fixed, as a predefined parameter. For each deviation a different maximum reliability distance can be set. e.g. the higher the number of allowed deviations, the lower the maximum reliability distance of the deviations, $d_1 \geq d_2 \geq \ldots \geq d_{d_c}$. In FIG. 4, $d_2$ is fixed to 8 and $d_3$ is fixed to 2. The maximum reliability distance $d_i$ is not shown in this figure but is equal to $n_m - 1$.

Using this scheme implicitly keeps the best or better syndromes in each $D_k$ and removes the less reliable ones. The cardinality of the subsets Di can be calculated as follows:

$$|D_k| = \begin{cases} \binom{d_c}{k} \cdot (d_k)^k & \text{if } d_k \geq 1;\, k > 0 \\ 1 & \text{if } k = 0 \\ 0 & \text{else} \end{cases}$$

Combining both proposed techniques strictly reduces the cardinality of S and thus the computational complexity. The most reliable syndromes are calculated and only unreliable ones are removed. The parameterization for the number of deviations and their maximum reliability distances is a critical step in the algorithm. Using for example only $D_0$, $D_1$ and $D_2$ with fixed reliability distances $d_0=0$; $d_1=n_m-1$; $d_2=2$, $d_c=4$ and $n_m=13$, shrinks |S| from 28561 to 73. For a code in GF(64) this is a very good trade-off between complexity and communications performance.

Another way to reduce the complexity is to simplify the sorting step. One big drawback of the processing presented hereinabove is that every syndrome set $S^i$ must or should be sorted separately to output the $n_m$ most reliable decorrelated syndromes. This is the case because of the decorrelation step applied before. To avoid the sorting of the decorrelated syndrome sets $S^i$, a simple but effective approach can be chosen. Instead of decorrelating every value, only syndromes using the most reliable element (LLR=0) from the currently handled output edge i are considered. All or most other syndromes are not used for the current output $V_i$. By this approach the order of the syndromes is not changed by the decorrelation step and it is sufficient to sort one set S instead of the $d_c$ sets $S^i$. In addition, the LLR values are not modified in the decorrelation step which saves a real valued subtraction for every element in the output $V_i$. Finally only the most reliable input element and not the complete input sets must or should be stored for the decorrelation.

Figure 6:
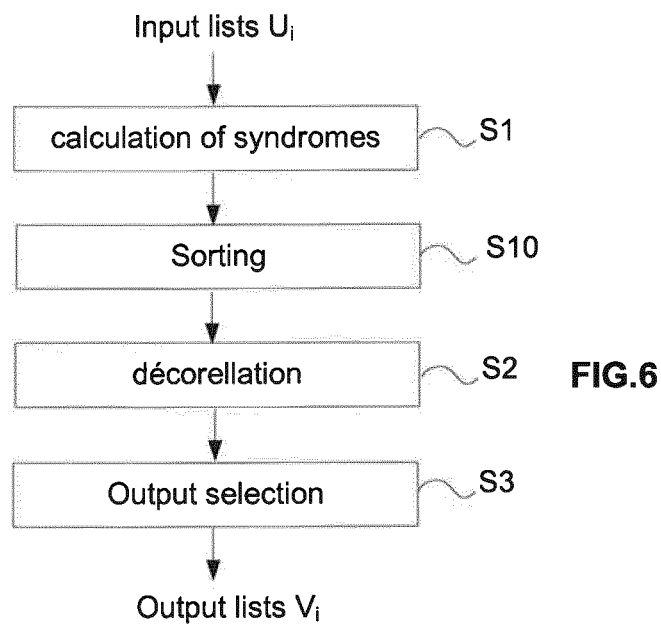
FIG. 6 is a flow chart illustrating the steps of a first variant of the syndrome-based method according to some embodiments.
Figure 7:
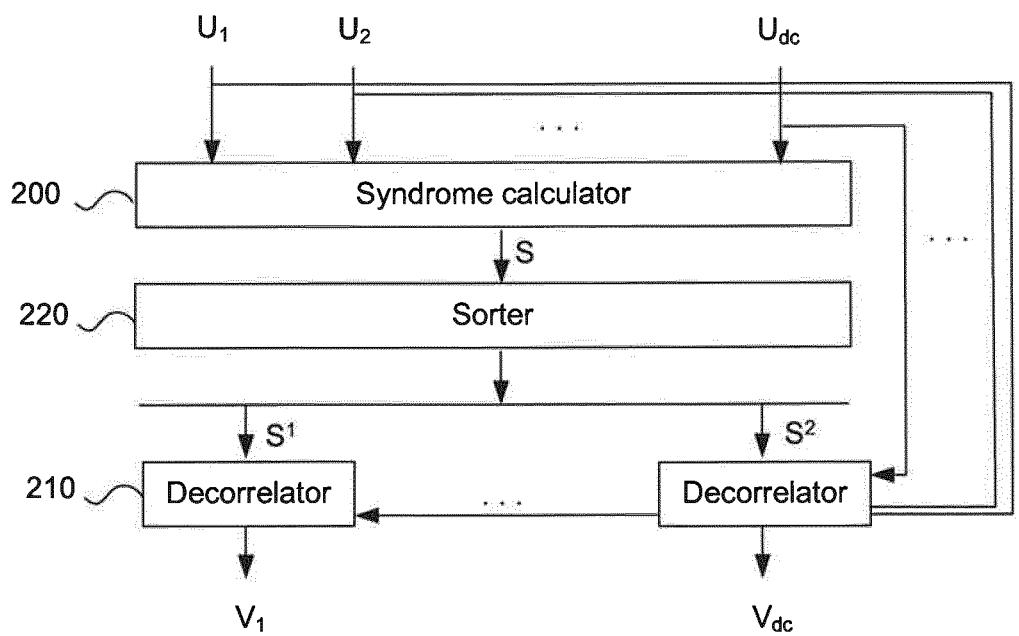
FIG. 7 is a schematic representation of a check node implementing the syndrome-based method of FIG. 6.

This simplified decorrelation allows also for the sorting step to be applied before the decorrelation step, as illustrated by FIGS. 6 and 7. It reduces the number of sorters from $d_c$ to 1. FIG. 6 shows a flow chart of this embodiment and FIG. 7 is an implementation of this embodiment.

In FIG. 6, the sorting operation which was executed in the output generation step S3 in FIG. 2 is here operated before the decorrelation step S3. The sorting operation, referenced S10, is applied on the syndromes of the set S. In FIG. 7, the check node includes a syndrome calculator 200 for generating the set of syndromes S, a sorter 220 for sorting the syndromes of S according to their LLR values and $d_c$ decorrelators 210 for applying the decorrelation to the sorted sets S.

Figure 8:
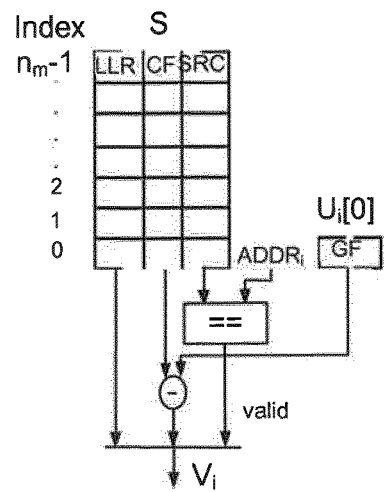
FIG. 8 is a schematic representation of a decorrelator of the check illustrated by FIG. 7.

FIG. 8 shows the schematic operations of one decorrelator of FIG. 7. In FIG. 8, each syndrome is denoted with an additional information SRC about which of the input edges contributed to the syndrome with a deviation. SRC in FIG. 8 stores the input edges where deviations occurred and $ADDR_i$ represents the current output edge. A simple comparison evaluates if a deviation from the current edge was involved in the syndrome calculation and thus if the syndrome is valid for the current edge or not. Only if no deviation occurred on the current edge, the decorrelated syndrome is marked as valid and used for the output $V_i$.

It has to be noted that the expression "edge" is used here interchangeably with the term input as each input corresponds to one edge in the Tanner graph.

Figure 9:
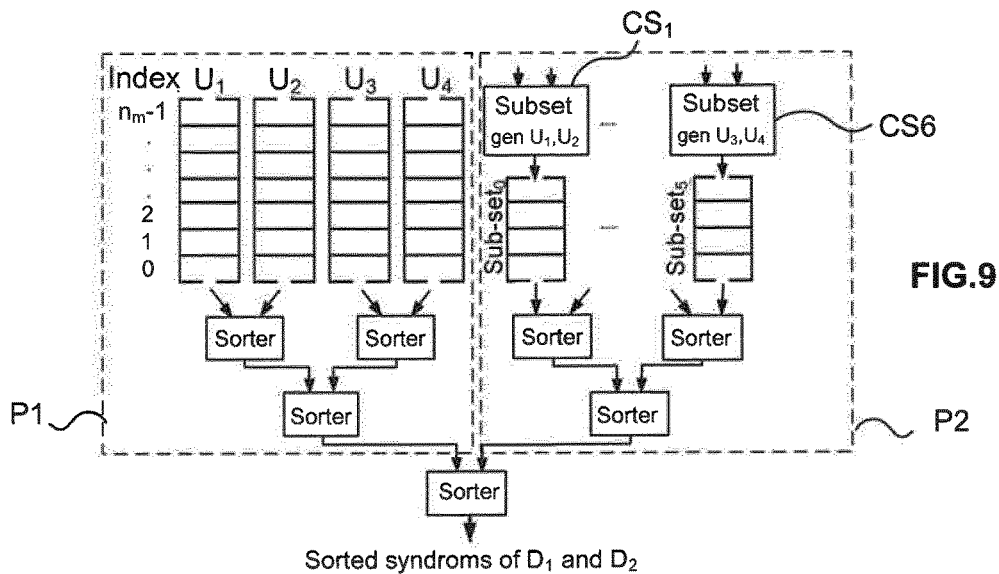
FIG. 9 is a schematic representation of a sorter for sorting syndromes of the deviation sets $D_1$ and $D_2$.

Even though the sorting has been reduced to the syndrome set S, there is more potential for simplification. Sorting S can be divided into sorting the deviation sets $D_i$ and merging them. Especially for $D_1$ the sorting can be further simplified. This is achieved due to the previous knowledge we have of the input data. We implicitly know that the lists $U_i$ are sorted according to their LLRs. The sorting of $D_1$ can thus be limited to merging $d_c$ sorted sets. For the higher-order deviations $D_i$ for i≥2, the sorting can also be simplified because of the sorted input lists. An example of the circuit for sorting the syndromes of $D_1$ and $D_2$, with $d_c$=4, is shown in FIG. 9. The part P1 is used for sorting the syndromes of $D_2$ and the part P2 is used for sorting the syndromes of $D_2$ with $d_2$=2.

As can be seen from FIG. 9 and as mentioned, the sorting of the syndromes of $D_1$ is simplified since the lists $U_i$ are already sorted according to their LLRs and the LLR of the syndrome is the LLR of the input element not having a LLR equal to zero.

For the syndromes of D2 (part P2 of FIG. 9), sorted sub-lists have first to be generated by six circuits $SC_p$ generating subsets of ordered input elements, one circuit $CS_1$ for generating a sorted sub-list of the input elements $U_i[1]$, $U_1[2]$, $U_2[1]$ and $U_2[2]$, one circuit $CS_2$ for generating a sorted sub-list of the input elements $U_1[1]$, $U_1[2]$, $U_3[1]$ and $U_3[2]$, one circuit $CS_3$ for generating a sorted sub-list of the input elements $U_1[1]$, $U_1[2]$, $U_4[1]$ and $U_4[2]$, one circuit $CS_4$ for generating a sorted sub-list of the input elements $U_2[1]$, $U_2[2]$, $U_3[1]$ and $U_3[2]$, one circuit $CS_5$ for generating a sorted sub-list of the input elements $U_2[1]$, $U_2[2]$, $U_4[1]$ and $U_4[2]$, and one circuit $CS_6$ for generating a sorted sub-list of the input elements $U_3[1]$, $U_3[2]$, $U_4[1]$ and $U_4[2]$.

Figure 10:
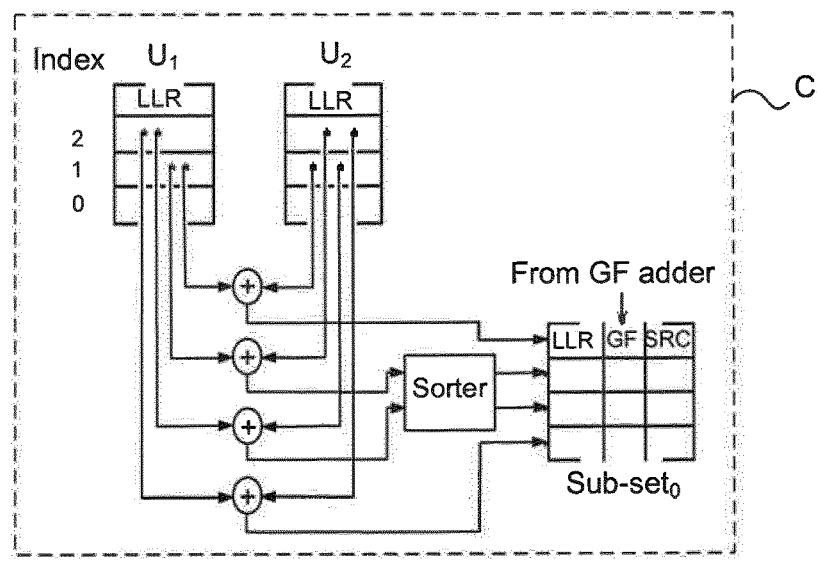
FIG. 10 is a schematic representation of a portion of the sorter of FIG. 9.

FIG. 10 shows the circuit $CS_1$ used for generating the sorted sub-list of the input elements $U_1[1]$, $U_1[2]$, $U_2[1]$ and $U_2[2]$. The circuit of FIG. 10 can be extended easily to other deviations and reliability distances. Once the sub-lists are sorted, the outputs can be generated by merging them sequentially as shown in FIG. 9.

In view of the above specification, three notable benefits arise from the method according to some embodiments
Significant reduction of |S|.
No LLR subtractions and no storage for Ui in the decorrelation step.

The method of some embodiments can further be simplified. Considering the NB-LDPC decoder as a whole, it can be observed, that an exact sorting of the check node outputs may not be required. When a variable node has calculated the a posteriori probability (APP) messages as the sum of the channel values and messages from the check nodes, they have to be resorted anyway. Thus an approximately sorted check node output is sufficient and does not impair the decoder's communications performance. Therefore, it is proposed hereinafter a new method which uses the robustness against approximately sorted check node outputs to further reduce the algorithms complexity.

Figure 11:
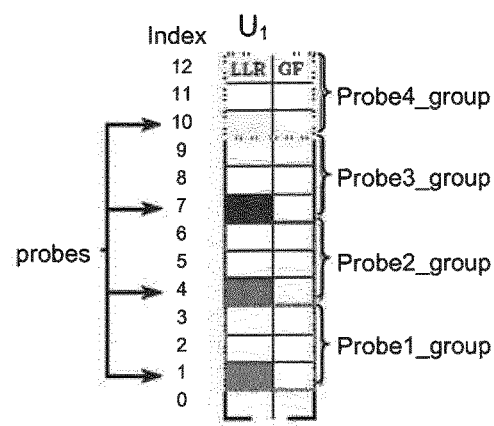
FIG. 11 is a schematic view showing the distribution of probes.

To allow for this approximate sorting, so called probes are chosen among the elements of the input lists $U_i$ and sorted according to their LLR. The LLR of each probe is considered as representative of the LLRs of the group of p neighboring elements including the probe. FIG. 11 shows the distribution of probes within the input list $U_1$ used for $D_1$. In this example, the probes are equally distributed in the input lists which work well for the investigated configuration. The considered probes are the elements indexed 1, 4, 7 and 10. However, for other parameters of $d_c$ and $n_m$ other distributions can be used.

In this figure, the probe is the input element having the lowest reliability value in the group of p neighboring input elements including the probe and the reliability value of the probe is the lowest reliability value of the elements of this group. In the example of FIG. 11, the LLR value of probe 1 (=$U_1[3]$) is considered as representative of the LLR values of all or most of the elements of the group probe1_group which includes the elements $U_1[1]$, $U_1[2]$ and $U_1[3]$. Of course, the LLR value of the probe can also be a combination of the LLR values of the elements of the group, for example the average value of the LLR values of the elements of the group.

In this embodiment, once the probes are selected, they are evaluated in order to select a reduced number of sorted probes, and then syndromes in the set S (which is for example $D_0 \cup D_1 \cup D_2$ with $d_2$=2) are selected based on these sorted probes, the selected syndromes being sorted in the order of the sorted probes.

Figure 12:
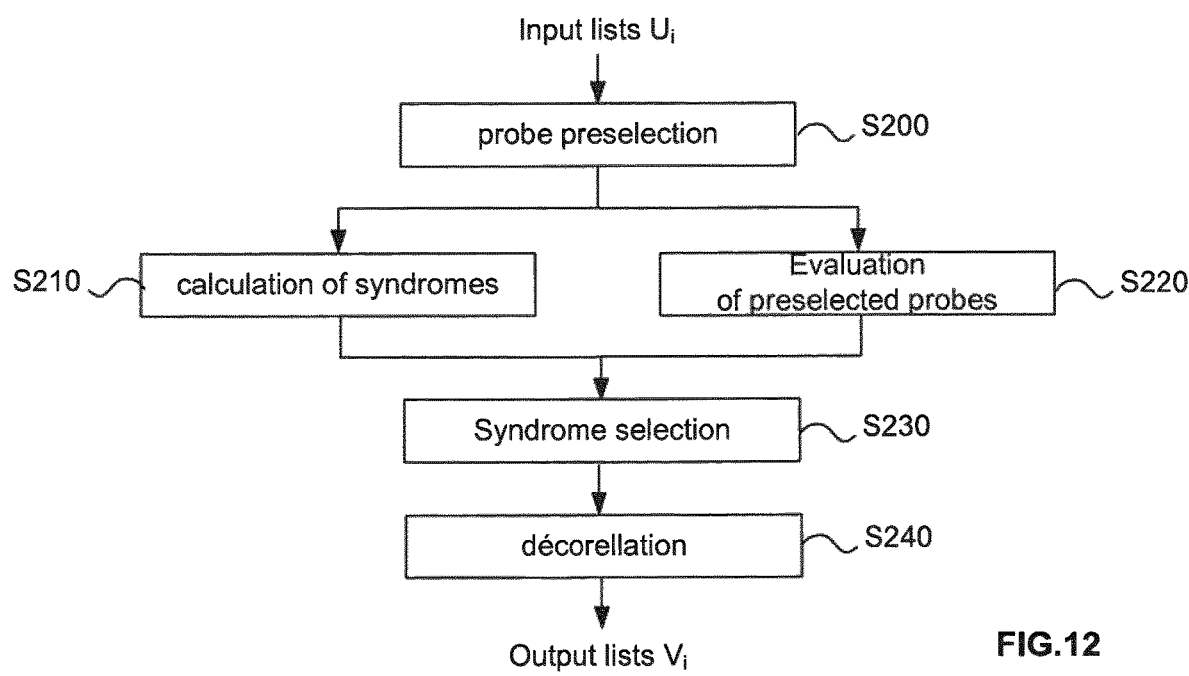
FIG. 12 is a flow chart illustrating the steps of a second variant of the syndrome-based method according to some embodiments using probes.

The flow chart of such an embodiment is illustrated by FIG. 12. The method includes the following steps:
Step S200: preselecting probes in the input lists $U_i$ as described before; this preselection can be a predefined one as described in FIG. 11; in this figure, the elements $U_i[j]$ with i=1;2;3;4 and j=3;6;9;12 are preselected; so 16 probes are preselected;

Step S210: calculating syndromes in order to generate the set of syndromes S;

Step S220: evaluating the preselected probes in order to select and sort a reduced predetermined number of the preselected probes, the probes, called final probes, being sorted according to the reliability values; the step S220 can be carried out before or after or in parallel with the step S210;

Step S230: selecting syndromes from the set S based on the final probes; the selected syndromes are sorted in the order of the final probes; and Step S240: applying a decorrelation to the sorted syndromes in order to generate the output lists $V_i$.

This scheme leads to some uncertainty in the set of syndromes issued from the step S230 but is close enough to the exact solution not to degrade the decoders communications performance.

Figure 13:
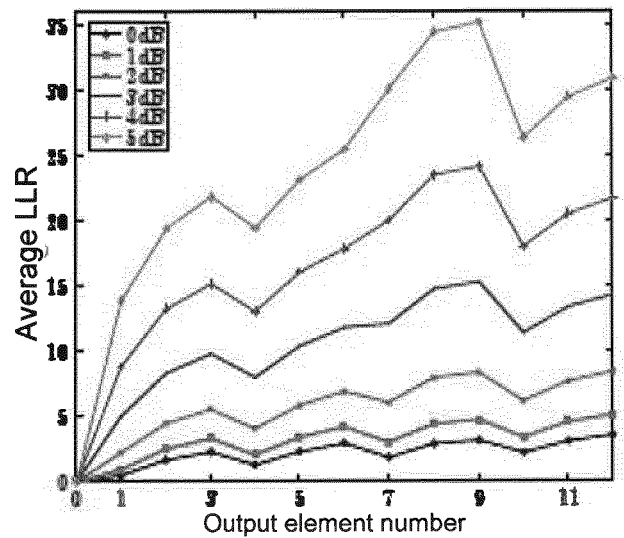
FIG. 13 are curves illustrating results of the method of FIG. 12.

FIG. 13 shows the LLR values of the approximately sorted syndromes used for the CN output calculation. The approximation works well for low LLRs (high reliability) and only for the less reliable outputs there is a difference compared to the optimal sorting results.

In the following, a hardware implementation of the inventive solution with use of probes is given. The architecture is independent of the actual used NB-LDPC code, only the parameters $d_c=4$, q=64 and $n_m=13$ are given.

Figure 14:
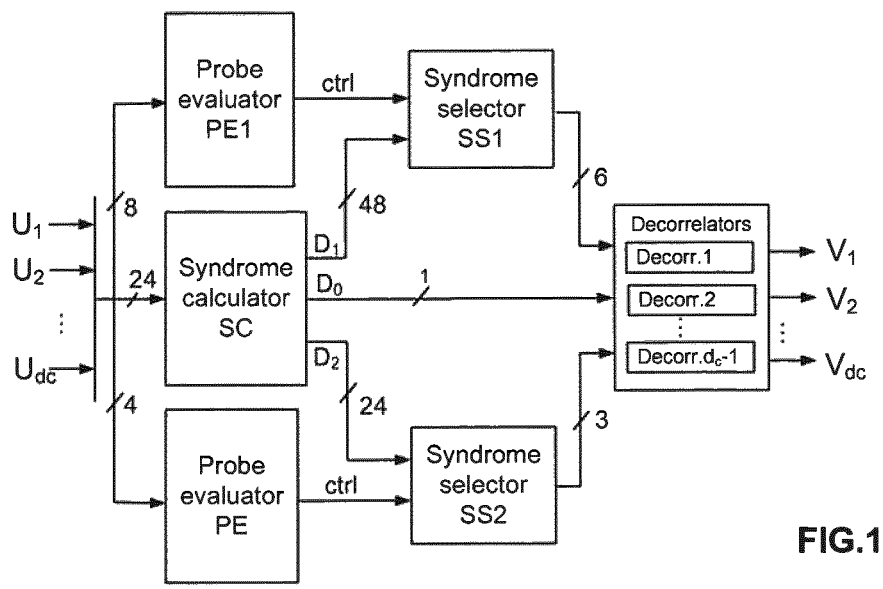
FIG. 14 is a schematic representation of a check node implementing the syndrome-based method of FIG. 12.

FIG. 14 shows an overview of the check node hardware. To achieve low latency and high throughput, the input parallelism of the check node is chosen to be six GF(q), LLR tuples and an additional GF(q) input for the most reliable element (LLR=0). All or most input elements $U_i[j]$ can thus be read within two clock cycles. The evaluation of the probes can be processed in parallel with the actual calculation of the syndrome set S. In this example, the syndrome set S is reduced to $D_0 \cup D_1 \cup D_2$ with $d_2=2$. $D_0$ includes 1 syndrome, $D_1$ includes 48 syndromes and $D_2$ includes 24 syndromes.

The check node includes
- a probe evaluator PE1 for determining a reduced number of probes used for selecting syndromes of $D_1$,
- a probe evaluator PE2 for determining a reduced number of probes used for selecting syndromes of $D_2$,
- a syndrome calculator SC for calculating the syndromes of $D_0$, $D_1$ and $D_2$,
- a syndrome selector SS1 for selecting, among the syndromes of $D_1$ generated by the syndrome calculator SC, 6 syndromes;
- a syndrome selector SS2 for selecting, among the syndromes of $D_2$ generated by the syndrome calculator SC, 3 syndromes; and
- $d_c$ decorrelators receiving the syndrome of $D_0$ and the syndromes of $D_1$ and $D_2$ selected by the syndrome selectors SS1 and SS2.

In this embodiment, once $S=D_0 \cup D_1 \cup D_2$ is calculated and the probes are sorted, the most reliable subsets selected by the syndrome selectors SS1 and SS2 are used for the decorrelation. The parallelism with which the syndromes are processed has significant impact on the overall throughput. It has been chosen to be three times three syndromes. In each clock cycle two sets of neighboring syndromes from $D_1$ and one set from $D_2$, overall nine syndromes are processed. Thus, after a maximum of four clock cycles all or most output edges are filled with $n_m$ valid messages. The output parallelism of the CN is chosen symmetrically to the inputs to be six GF(q), LLR tuples and one GF(q) message for $D_0$.

Figure 15:
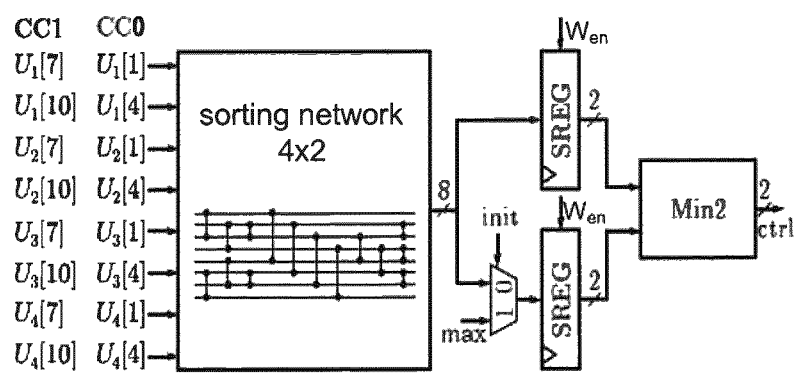
FIG. 15 is a schematic representation of a probe evaluator of the check node of FIG. 14.

An example of the probe evaluator PE1 is illustrated by FIG. 15. This probe evaluator processes two probes per input edge in each clock cycle. For $d_c=4$ overall eight LLRs have to be sorted, which is performed by a latency optimized sorting network. As each two probes are implicitly sorted already because they belong to the same input list, some simplifications on the network can be applied.

The probe evaluator PE1 receives the probes $U_1[1]$, $U_1[4]$, $U_2[1]$, $U_2[4]$, $U_3[1]$, $U_3[4]$, $U_4[1]$, $U_4[4]$ in a first cycle and the probes $U_1[7]$, $U_1[10]$, $U_2[7]$, $U_2[10]$, $U_3[7]$, $U_3[10]$, $U_4[7]$, $U_4[10]$ in a second cycle. These probes are processed by a sorting network. The result of the sorting is not a sorted list of LLRs but rather the positions of the inputs where they come from. They are stored in a register and the same task is performed a second time for the second half of the input LLRs in the next clock cycle. Starting from the second clock cycle, every following clock cycle the positions of the two smallest probes are output. To perform this task, an additional sorter, selecting the two smallest probes from the registers is utilized. Once a probe is used for an output generation, it is removed by shifting the register content accordingly. The probe evaluator PE2 for $D_2$ is a simplified version of the one for $D_1$ as it considers only four inputs. Moreover it needs to generate only one output per clock cycle. The output of the probe evaluators is used as control signal for the syndrome selector components.

Figure 16:
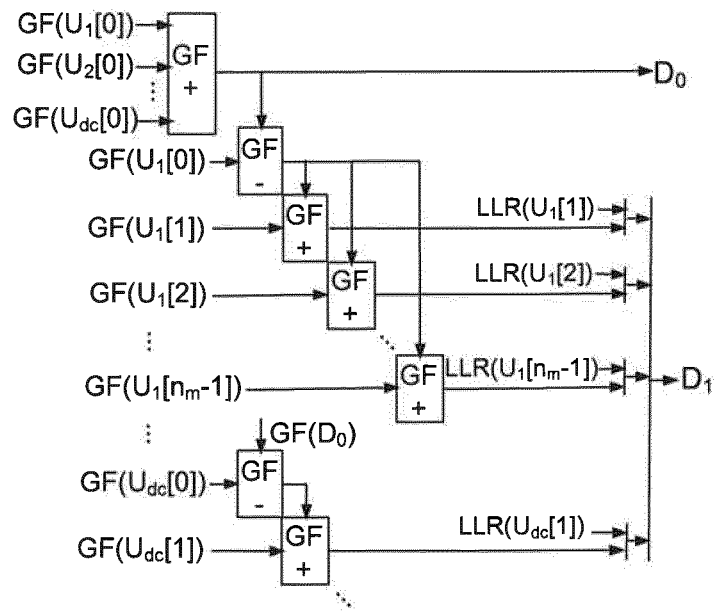
FIG. 16 is a schematic representation of a syndrome calculator of the check node of FIG. 14.

FIG. 16 depicts partially an example of the syndrome calculator SC. The syndrome calculation is carried out fully parallel. Due to the restrictions on the deviation reliability distances ($d_0=0$, $d_1=n_m-1$, $d_2=2$), the required hardware is strictly limited. A sophisticated scheme for the calculation allows for further reduced hardware cost. Instead of calculating each syndrome as a sum of $d_c$ inputs, intermediate results are used to minimize the number of explicit calculations. The calculation of $D_0$ involves $d_c-1$ GF(q) additions, for $D_1$ overall $d_c \cdot n_m$ GF(q) additions may be required. Thus for $D_0$ and $D_1$ only GF(q) calculations may be required. For $D_2$ the processing scheme of $D_1$ can easily be extended and may require only one real valued addition per syndrome in addition to the GF(q) operations. Compared with state-of-the-art processing, there is a significant saving in computational complexity. The output of the syndrome calculator is a number of sorted subsets used as input for the syndrome selectors.

Figure 17:
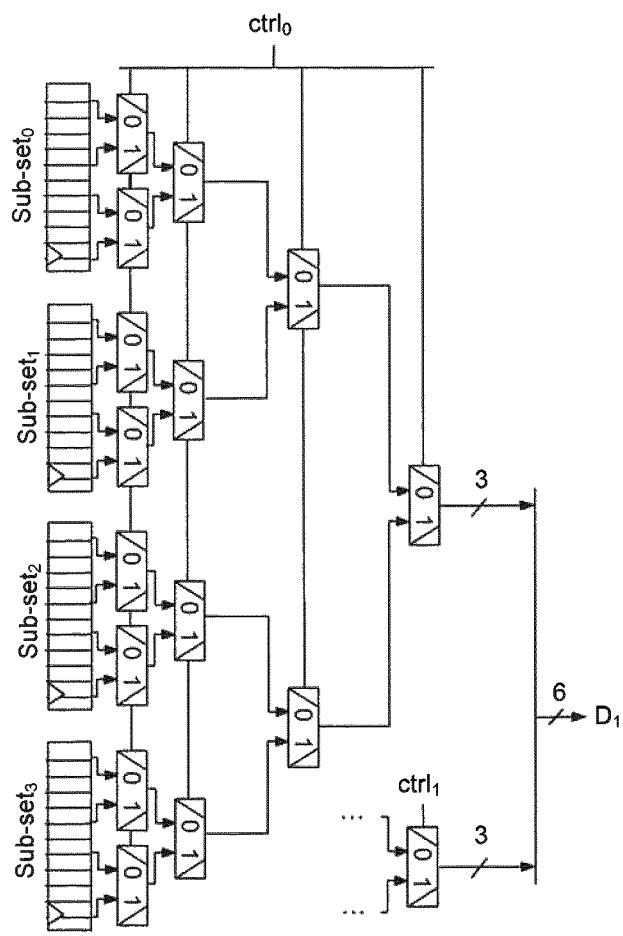
FIG. 17 is a schematic representation of a syndrome selector of the check node of FIG. 14.

FIG. 17 depicts partially an example of the syndrome selector SS1 for $D_1$. The syndrome selector receives the addresses of the most reliable syndrome sets from the probe evaluator PE1 and the syndromes $D_i$ sorted in sub-sets from the syndrome calculator. The complete hardware can include or can consist of a multiplexer tree choosing a set of the three most reliable syndromes from the subsets. To achieve six messages from $D_1$, the multiplexer tree of FIG. 17 is to be duplicated in this unit. For $D_2$ a single tree choosing between the six sub-sets of $D_2$ suffices.

The decorrelation has to be performed individually for each output edge of the check node. The output parallelism of the decorrelator is six messages per clock cycle. Two times three syndromes from $D_1$ and another three from $D_2$ are processed per clock cycle. By construction the messages of a set usually have deviations on the same edges. Thus it is sufficient to check for one of the messages in a set if it is valid or not, which is indicated with a valid flag. If only a part of the received sets is valid, they are rearranged by multiplexers in such a way, that only valid messages are used for the output. In the best or better case all or most syndromes received in one clock cycles are valid. As the output parallelism is only six, the surplus syndromes are stored in an additional register and reused in the next clock cycle. Before the messages are sent to the variable node, the actual decorrelation is applied which is a subtraction of the most reliable GF(q) value of the current input edge.

In the hardware implementation of FIG. 14, all or most of the syndromes of $D_1$ and $D_2$ are generated by the syndrome calculator SC and only nine of them are selected by the syndrome selectors SS1 and SS2.

Figure 18:
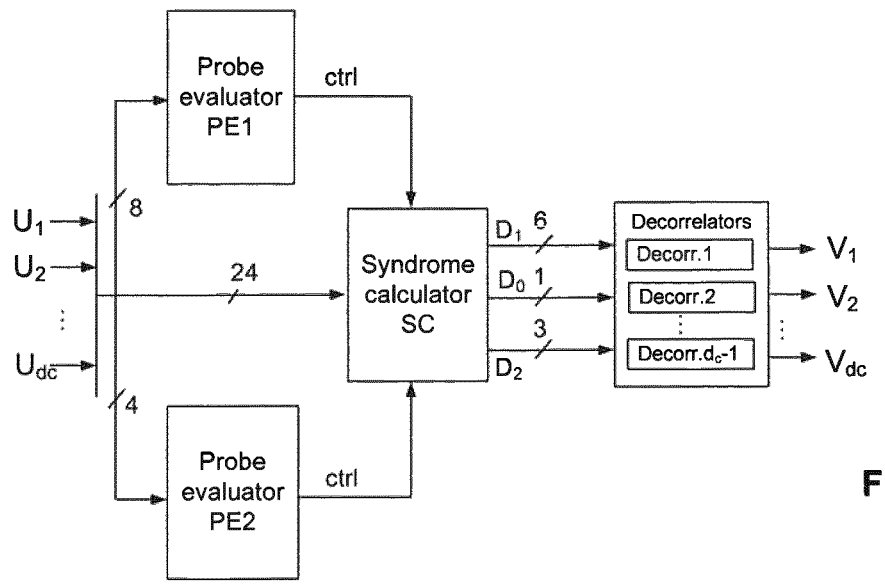
FIG. 18 is a schematic representation of a variant of the check of FIG. 14.
Figure 19:
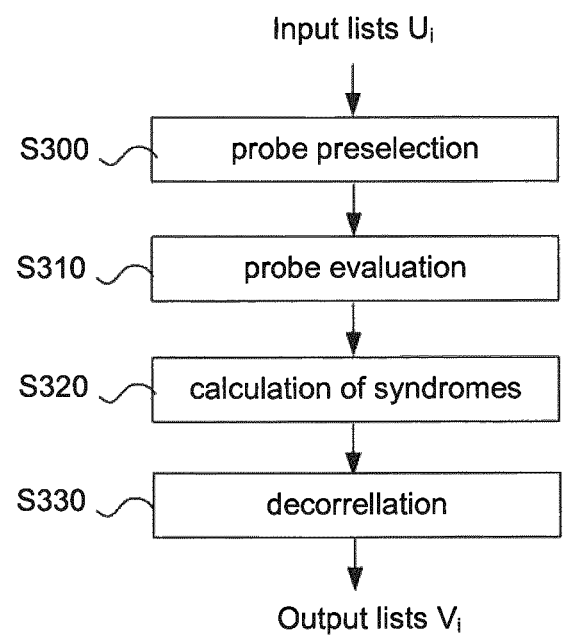
FIG. 19 is a flow chart illustrating the steps of the syndrome-based method implemented by the check node of FIG. 18.

In a variant illustrated by FIG. 18 and FIG. 19, it is proposed to only generate the syndromes that will be decorrelated. In this variant, the control signals ctrl generated by the probe evaluators are transmitted to the syndrome calculator SC such that the latter one only generates the syndrome of $D_0$ and the nine syndromes of $D_1$ and $D_2$ to be decorrelated. The syndrome selectors SS1 and SS2 are removed.

The method executed by the check node in this variant can be summarized the following steps depicted in FIG. 19:

Step S300: preselecting probes in the input lists $U_i$ as described before, Step S310: evaluating the probes in order to select and sort a predetermined number of the preselected probes, called final probes, the probes being sorted according to the reliability values;

Step S320: calculating a reduced number of syndromes based on the final probes; and Step S340: applying a decorrelation to the sorted syndromes in order to generate the output lists $V_i$.

The invention claimed is:

1. A method for controlling a check node of a decoder for decoding non-binary LDPC codes, the check node receiving dc input lists Ui of nm elements (Ui[j]) and delivering dc output lists Vi of n'm elements (Vi[j]), with "i∈[1. . . " "d" "c" "]", with dc>2, each element of the input or output lists, called respectively input element and output, comprising a reliability value (LLR(Ui[j]), LLR(Vi[j])) associated to a symbol (GF(Ui[j]), GF(Vi[j])) of a Galois Field GF(q) with q>nm and q>n'm, the input elements and output elements being substantially sorted according to the reliability values respectively in the input list and output list, the method comprising:

adding dc input elements of input lists Ui in order to generate a plurality of sums called syndromes, each of the input elements belonging to a distinctive input list among the dc input lists Ui and each syndrome comprising a reliability value which is the sum of the reliability values of the input elements and a symbol of the Galois field which is the sum of the symbols of the input elements in the Galois field, applying, for each output list Vi, a decorrelation to the syndromes by subtracting the input element of the input list Ui from the syndromes in order to generate decorrelated syndromes, and selecting, for each output list Vi, as output elements of the output list Vi, the n'm decorrelated syndromes having the highest reliability values and generated for the output list Vi.

2. The method according to claim 1, wherein, in the adding step, each syndrome is generated based on at most k input elements different from the input elements having the highest reliability values, with k<dc.

3. The method according to claim 1, wherein, in the adding step, each syndrome is generated based on input elements whose distance, called reliability distance, from the input elements having the highest reliability values is lower than a maximum reliability distance.

4. The method according to claim 3, wherein the maximum reliability distance is depending on k.

5. The method according to claim 1, wherein the output elements of the output list Vi are selected by sorting the decorrelated syndromes generated for the output list Vi according to the reliability values and by selecting the n'm decorrelated syndromes having the highest reliability values.

6. The method according to claim 1, wherein, for an output list Vi to be generated, the decorrelation is applied to syndromes generated from the input element of the input list Ui having the highest reliability values.

7. The method according to claim 6, wherein, before the decorrelation step, the syndromes are sorted according to the reliability values of the syndromes such that, after the decorrelation step, the decorrelated syndromes generated for the output list Vi are sorted according to the reliability values, and the elements of the output list Vi are the n'm decorrelated syndromes having the highest reliability values.

8. The method according to claim 1, wherein, before or after or in parallel with the syndrome generation, the method further comprises the steps of:

preselecting input elements, called probes, in the input lists Ui, each probe having a reliability value representative for a group of p neighboring input elements comprising the probe, evaluating the preselected probes in order to select and sort a predetermined number of the preselected probes, the probes, called final probes, being sorted according to the reliability values; and selecting generated syndromes based on the final probes, the syndromes being sorted in the order of the final probes.

9. The method according to claim 8, wherein the probe is the input element having the highest reliability value in the group of p neighboring input elements comprising the probe and the reliability value of the probe is the highest reliability value.

10. The method according to claim 8, wherein the reliability value of the probe is a combination of the reliability values of the p neighboring input elements.

11. The method according to claim 1, wherein, before the syndrome generation, the method further comprises the steps of:

preselecting input element, called probes, in the input lists Ui, each probe having a reliability value representative for a group of p neighboring input elements comprising the probe, and evaluating the preselected probes in order to select and sort a predetermined number of the preselected probes, the probes, called final probes, being sorted according to the reliability values; and wherein in the syndrome generation step, the syndromes are generated based on the final probes, the syndromes being sorted in the order of the final probes.

12. A check node of a decoder for decoding non-binary LDPC codes comprising:

dc inputs for receiving dc input lists Ui of nm elements (Ui[j]), called input elements, with "i ∈[1. . . " "d" "c" "]", nm>1 and dc>2, each input element comprising a reliability value (LLR(Ui[j])) associated to a symbol (GF(Ui[j])) of a Galois Field GF(q) with q>nm, the input elements being substantially sorted according to the reliability values in the input list, dc outputs for delivering dc output lists Vi of n'm elements (Vi[j])called output elements, with q>n'm, each output element comprising a reliability value (LLR(Vi[j])) associated to a symbol (GF(Vi[j])) of a Galois Field GF(q), the output elements being substantially sorted according to the reliability values in the output list, a syndrome calculator for adding dc input elements of input lists Ui in order to generate a plurality of sums called syndromes, each of the input element belonging to a distinctive input list among the dc input lists Ui and each syndrome comprising a reliability value which is the sum of the reliability values of the input elements and a symbol of the Galois field which is the sum of the symbols of the input elements in the Galois field, dc decorrelators for applying, for each output list Vi, a decorrelation to the syndromes by subtracting the input element of the input list Ui from the syndromes in order to generate decorrelated syndromes, and selecting selector that selects, for each output list Vi, as output elements for the output list Vi, n'm decorrelated syndromes having the highest reliability values and generated for the output list Vi.

13. The check node according to claim 12, further comprising dc sorters for sorting the decorrelated syndromes according to the reliability values, each one of the sorters being dedicated for sorting the decorrelated syndromes generated for a dedicated output list Vi.

14. The check node according to claim 12, further comprising one sorter for sorting the syndromes generated by the syndrome calculator according to the reliability values, the decorrelation being applied, for an output list Vi to be generated, to syndromes generated from the input element of the input list Ui having the highest reliability values.

15. The check node according to claim 12, further comprising:

a probe selector for selecting input elements, and in particular probes, in the input lists Ui, each probe having a reliability value representative for a group of p neighboring input elements comprising the probe, a probe sorter for sorting the probes according to the reliability values, and a syndrome selector selecting generated syndromes based on the sorted probes, the syndromes being sorted in the order of the sorted probes.

16. The check node according to claim 12, further comprising:

a probe selector for selecting input elements, and in particular probes, in the input lists Ui, each probe having a reliability value representative for a group of p neighboring input elements comprising the probe, and a probe sorter for sorting the probes according to the reliability values, wherein the syndrome calculator is driven to generate syndromes based on the sorted probes, the syndromes being sorted in the order of the sorted probes.

* * * * *